United States Patent
Han

(10) Patent No.: US 8,232,954 B2
(45) Date of Patent: Jul. 31, 2012

(54) SHIFT REGISTER AND ORGANIC LIGHT EMITTING DISPLAY DEVICE USING THE SAME

(75) Inventor: Sam-Il Han, Yongin (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 485 days.

(21) Appl. No.: 12/568,588

(22) Filed: Sep. 28, 2009

(65) Prior Publication Data
US 2010/0177087 A1      Jul. 15, 2010

(30) Foreign Application Priority Data
Jan. 13, 2009    (KR) .................. 10-2009-0002649

(51) Int. Cl.
*G11C 19/00*    (2006.01)
(52) U.S. Cl. ........... 345/100; 345/82; 345/204; 345/46; 377/64; 377/79
(58) Field of Classification Search .................. 345/100, 345/82, 204; 377/64, 79
See application file for complete search history.

(56) References Cited

U.S. PATENT DOCUMENTS

| | | | |
|---|---|---|---|
| 8,040,293 B2* | 10/2011 | Jeong | 345/46 |
| 2004/0090412 A1* | 5/2004 | Jeon et al. | 345/100 |
| 2006/0164376 A1* | 7/2006 | Moon | 345/100 |
| 2008/0062071 A1* | 3/2008 | Jeong | 345/46 |
| 2008/0062097 A1* | 3/2008 | Jeong et al. | 345/84 |

FOREIGN PATENT DOCUMENTS

| | | |
|---|---|---|
| KR | 10-0610611 B1 | 8/2006 |
| KR | 10-2007-0002530 A | 1/2007 |
| KR | 10-0707617 B1 | 4/2007 |
| KR | 10-2007-0101474 A | 10/2007 |
| KR | 10-2008-0022688 A | 3/2008 |
| KR | 10-2008-0033630 A | 4/2008 |
| KR | 10-2008-0114378 A | 12/2008 |
| KR | 10-1023722 B1 | 3/2011 |

OTHER PUBLICATIONS

Korean Office Action dated Feb. 25, 2011 for Korean Patent Application No. KR 10-2009-0002649 which corresponds to the captioned application.
Korean Office Action dated Feb. 25, 2011 for Korean Patent Application No. KR 10-2009-0002232 corresponding to U.S. Appl. No. 12/568,521, filed Sep. 28, 2009, which is related to the captioned application.

* cited by examiner

*Primary Examiner* — Van Chow
(74) *Attorney, Agent, or Firm* — Knobbe Martens Olson & Bear, LLP

(57) ABSTRACT

A shift register is disclosed. The shift register has a plurality of stages dependently coupled to an input line of a start pulse and is driven by first, second and third clock signals respectively input to first, second and third input lines. The shift register includes a voltage controller to prevent leakage currents.

20 Claims, 4 Drawing Sheets

SHIFT REGISTER AND ORGANIC LIGHT EMITTING DISPLAY DEVICE USING THE SAME

CROSS-REFERENCE TO RELATED APPLICATIONS

This application claims priority to and the benefit of Korean Patent Application No. 10-2009-0002649, filed on Jan. 13, 2009, in the Korean Intellectual Property Office, the entire content of which is incorporated herein by reference.

BACKGROUND

1. Field

The technology relates to a shift register and an organic light emitting display device using the same, and more particularly, to a shift register in a driving circuit for an organic light emitting display device using the same.

2. Description of the Related Technology

An organic light emitting display device has a pixel array arranged in a matrix form near intersections of data and scan lines.

The pixel array is driven by a scan driving unit supplying scan signals to the scan lines and a data driving unit supplying data signals to the data lines.

The scan driving unit has a shift register that sequentially outputs scan signals to the scan lines so as to select pixels which receive a data signal supplied for each line in the pixel array.

The shift register includes stages each having a plurality of transistors.

However, when leakage current caused by off-current of a transistor or the like is generated in the shift register, the output of the shift register may be unstable.

SUMMARY OF CERTAIN INVENTIVE ASPECTS

One aspect is a shift register including a plurality of serially connected stages, where one of the stages is connected to an input line of a start pulse. The shift register is driven by first, second, and third clock signals, respectively input to first, second and third input lines. Each of the stages includes a first transistor coupled between a first power source and an output node, the first transistor having a gate electrode coupled to a first node, a second transistor coupled between the output node and the third input line, the second transistor having a gate electrode coupled to a second node, a third transistor coupled between the first power source and the first node, the third transistor having a gate electrode coupled to an input terminal to which the start pulse or an output signal of a previous stage is input, a fourth transistor coupled between the first node and a second power source, the fourth transistor having a gate electrode coupled to the first input line, a fifth transistor coupled between the second node and a third node, the fifth transistor having a gate electrode coupled to the second power source, a sixth transistor coupled between the third node and the second power source, the sixth transistor having a gate electrode coupled to the input terminal, and a voltage controller coupled between the first and second power sources, the voltage controller being further coupled to the input terminal, the first input line and the third node, where the voltage controller is configured to control the voltage at the third node in response to the start pulse or output signal of the previous stage and the first clock signal.

Another aspect is an organic light emitting display device including a pixel unit having a plurality of pixels positioned near intersections of scan and data lines, a data driving unit configured to apply data signals to the data lines, and a scan driving unit having a shift register configured to sequentially apply scan signals to the scan lines, where the shift register includes a plurality of serially connected stages, where one of the stages is connected to an input line of a start pulse and is driven by first. The display also includes second and third clock signals respectively input to first, second and third input lines, and each of the stages includes a first transistor coupled between a first power source and an output node, the first transistor having a gate electrode coupled to a first node, a second transistor coupled between the output node and the third input line, the second transistor having a gate electrode coupled to a second node, a third transistor coupled between the first power source and the first node, the third transistor having a gate electrode coupled to an input terminal to which the start pulse or an output signal of a previous stage is input, a fourth transistor coupled between the first node and a second power source, the fourth transistor having a gate electrode coupled to the first input line, a fifth transistor coupled between the second node and a third node, the fifth transistor having a gate electrode coupled to the second power source, a sixth transistor coupled between the third node and the second power source, the sixth transistor having a gate electrode coupled to the input terminal, and a voltage controller coupled between the first and second power sources, the voltage controller being further coupled to the input terminal, the first input line, and the third node, where the voltage controller is configured to control the voltage at the third node in response to the start pulse or output signal of the previous stage and the first clock signal.

Another aspect is a shift register including a plurality of serially connected stages, where one of the stages is connected to an input line of a start pulse, the shift register being driven by first, second and third clock signals, respectively input to first, second, and third input lines, where each of the stages includes a first transistor coupled between a first power source and an output node, the first transistor having a gate electrode coupled to a first node, a second transistor coupled between the output node and the third input line, the second transistor having a gate electrode coupled to a second node, a third transistor coupled between the first power source and the first node, the third transistor having a gate electrode coupled to an input terminal to which the start pulse or an output signal of a previous stage is input, a fourth transistor coupled between the first node and a second power source, the fourth transistor having a gate electrode coupled to the first input line, a fifth transistor coupled between the second node and a third node, the fifth transistor having a gate electrode coupled to the second power source, a sixth transistor coupled between the third node and the second power source, the sixth transistor having a gate electrode coupled to the input terminal, and means for controlling the voltage at the third node in response to the start pulse or output signal of the previous stage and the first clock signal.

BRIEF DESCRIPTION OF THE DRAWINGS

The accompanying drawings, together with the specification, illustrate exemplary embodiments, and, together with the description, serve to explain principles of the present invention.

DETAILED DESCRIPTION OF CERTAIN INVENTIVE EMBODIMENTS

Figure 1:
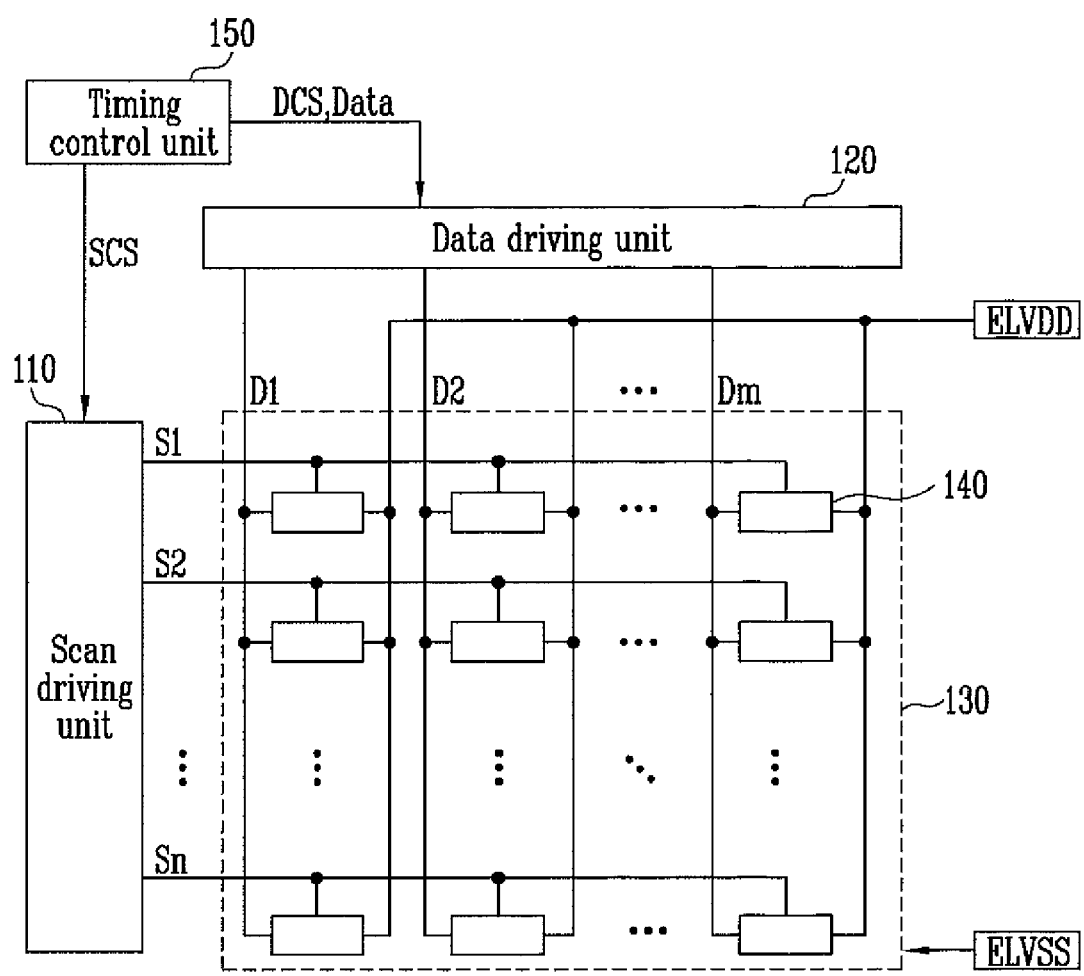
FIG. 1 is a block diagram of an organic light emitting display device according to an embodiment.

Hereinafter, certain exemplary embodiments will be described with reference to the accompanying drawings. Here, when a first element is described as being coupled to a second element, the first element may be not only directly coupled to the second element or may be indirectly coupled to the second element via a third element. Also, like reference numerals generally refer to like elements throughout.

FIG. 1 is a block diagram of an organic light emitting display device according to an embodiment.

Referring to FIG. 1, the organic light emitting display device includes a pixel unit 130 having pixels 140 formed in portions partitioned according to scan lines S1 to Sn and data lines D1 to Dm; a scan driving unit 110 driving the scan lines S1 to Sn; a data driving unit 120 driving the data lines D1 to Dm; and a timing control unit 150 controlling the scan driving unit 110 and the data driving unit 120.

The scan driving unit 110 receives a scan driving control signal SCS supplied from the timing control unit 150 to generate scan signals and supplies the generated scan signals to the scan lines S1 to Sn. The scan driving control signal SCS contains a start pulse. SP, clock signals CLK and the like.

To this end, the scan driving unit 110 includes a shift register that sequentially generates scan signals in response to the start pulse SP and the clock signals CLK and applies the scan signals to the scan lines S1 to Sn.

The data driving unit 120 receives a data driving control signal DCS and a data Data supplied from the timing control unit 150 to generate data signals. The data signals generated from the data driving unit 120 are supplied to the data lines D1 to Dm in synchronization with the scan signals.

The timing control unit 150 generates a scan driving control signal SCS and a data driving control signal DCS in response to synchronization signals. The scan driving control signal SCS generated from the timing control unit 150 is supplied to the scan driving unit 110, and the data driving control signal DSC generated from the timing control unit 150 is supplied to the data driving unit 120. The timing control unit 150 supplies a data Data supplied from the outside to the data driving unit 120.

The pixel unit 130 includes a plurality of pixels 140 positioned near intersections of the scan lines S1 to Sn and the data lines D1 to Dm. Each of the pixels 140 receives first and second pixel power sources ELVDD and ELVSS and receives scan and data signals respectively supplied from the scan and data driving units 110 and 120. Each of the pixels 140, which receives the first and second pixel power sources ELVDD and ELVSS and the scan and data signals, generates light corresponding to the data signal.

Figure 2:
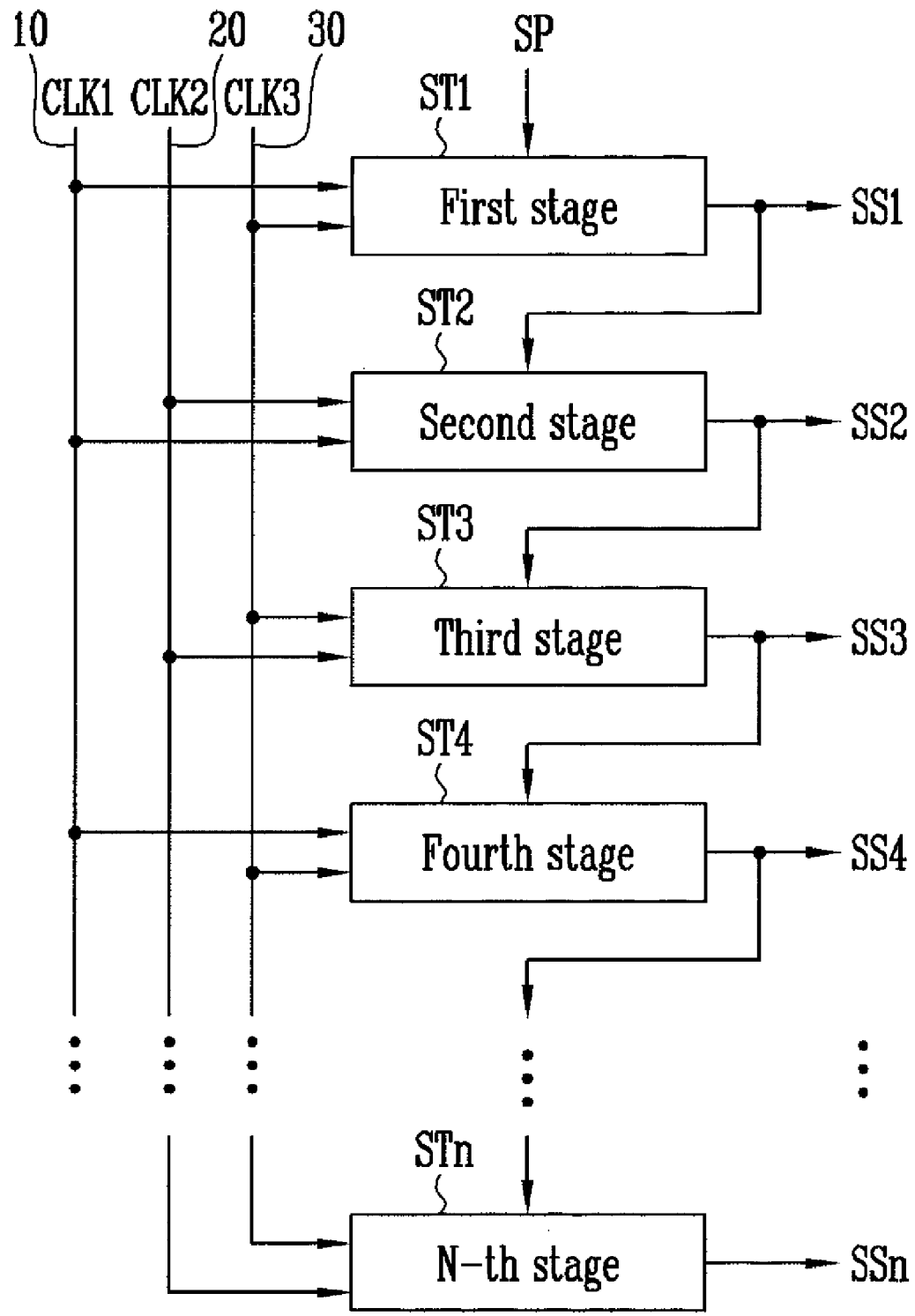
FIG. 2 is a block diagram showing an example of a shift register included in a scan driving unit of FIG. 1.

FIG. 2 is a block diagram showing an example of a shift register included in a scan driving unit of FIG. 1.

Referring to FIG. 2, the shift register includes a plurality of stages ST1 to STn dependently coupled to an input line of a start pulse SP. The shift register is driven by first, second and third clock signals CLK1, CLK2 and CLK3 respectively input from the first, second and third input lines 10, 20 and 30.

The three clock signals CLK1, CLK2 and CLK3 are configured so that their phases are sequentially delayed, and each of the stages ST is coupled to lines of two clock signals out of the three clock signals CLK1, CLK2 and CLK3. A clock signal obtained by allowing a clock signal CLK input to a previous stage to be phase-delayed is supplied to each of the next stages.

For example, when the first stage ST1 is driven with first and third clock signals CLK1 and CLK3 respectively input from the first and third input lines 10 and 30, the second stage ST2 receives second and first clock signals CLK2 and CLK1 respectively, the second and first clock signals CLK2 and CLK1 are phase-delayed versions of the first and third clock signals CLK1 and CLK3, respectively. Such a phase configuration is shown among CLK1, CLK2, and CLK3 of FIG. 4.

If the start pulse SP and the first, second, and third clock signals CLK1, CLK2 and CLK3 are input to the shift register, the first stage ST1 outputs a first scan signal SS1 obtained by allowing the start pulse supplied to the first stage ST1 to be phase-delayed by one clock in response to the first and third clock signals CLK1 and CLK3. The first scan signal SS1 is output through the first scan line (S1 of FIG. 1) and is also supplied to the second stage ST2.

Then, the second stage ST2 outputs a second scan signal SS2 obtained by allowing the first scan signal SS1 supplied to the second stage ST2 to be phase-delayed by one clock in response to the second and first clock signals CLK2 and CLK1. The second scan signal SS2 is output through the second scan line S2 and also supplied to the third stage ST3.

Each of the following stages ST likewise allow the start pulse or output signal (scan signal) of its previous stage to be phase-delayed by one clock, thereby sequentially outputting scan signals SS to the scan lines S.

Figure 3:
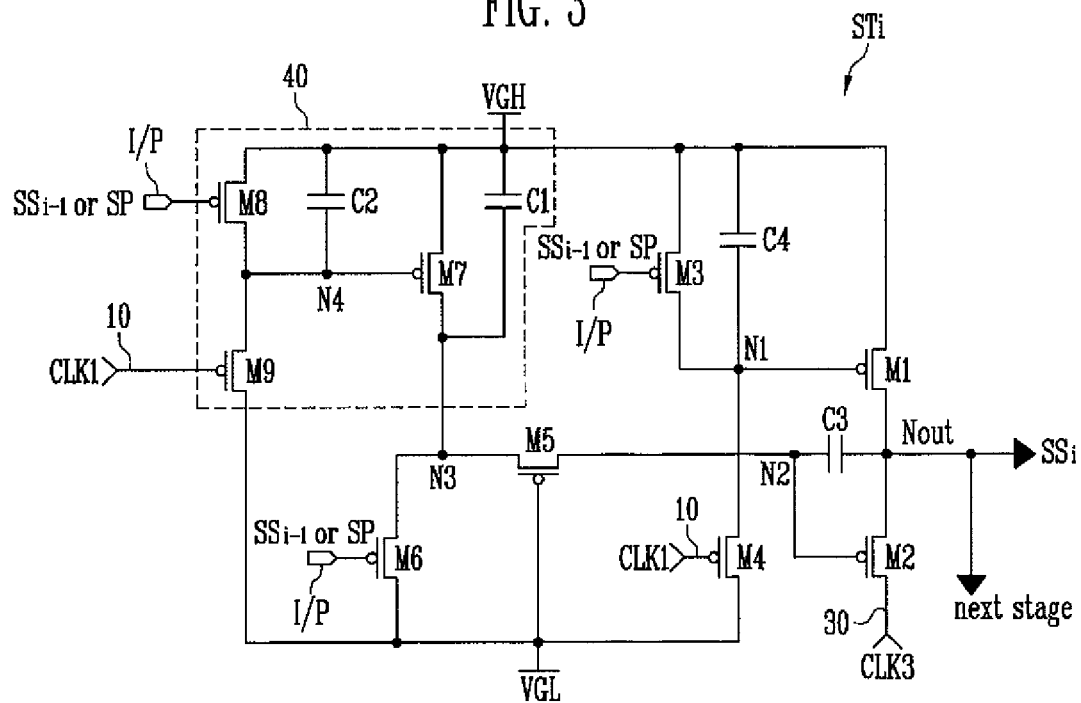
FIG. 3 is a circuit diagram showing an example of a stage shown in FIG. 2.

FIG. 3 is a circuit diagram showing an example of a stage shown in FIG. 2.

Referring to FIG. 3, the stage STi includes first to sixth transistors M1 to M6, a voltage controller 40, and third and fourth capacitors C3 and C4.

The first transistor M1 is coupled between an output node Nout and a first power source VGH that is a gate high-level voltage source. A gate electrode of the first transistor M1 is coupled to a first node N1.

When the voltage level at the first node N1 is a low level, the first transistor M1 is turned on to allow the first power source VGH to be electrically coupled to the output node Nout. That is, when the first transistor M1 is turned on, a high-level output signal SSi is output to the output node Nout.

The second transistor M2 is coupled between the output node Nout and the input line 30. A gate electrode of the second transistor M2 is coupled to a second node N2.

When the voltage level at the second node N2 is a low level, the second transistor M2 is turned on to allow the output node Nout to be electrically coupled to the input line 30. That is, when the second transistor M2 is turned on, the waveform of the output signal SSi corresponds to that of the third clock signal CLK3.

The third transistor M3 is coupled between the first power source VGH and the first node N1. A gate electrode of the third transistor M3 is coupled to an input terminal I/P to which a start pulse SP or an output signal SSi-1 of a previous stage is input.

The third transistor M3 controls the voltage level at the first node N1 in response to the start pulse SP or the output signal SSi-1 of the previous stage.

The fourth transistor M4 is coupled between the first node N1 and a second power source VGL that is a gate low-level voltage source. A gate electrode of the fourth transistor M4 is coupled to the first input line 10.

The fourth transistor M4 controls the voltage level at the first node N1 in response to the first clock signal CLK1 supplied from the input line 10.

The fifth transistor M5 is coupled between the second node N2 and a third node N3. A gate electrode of the fifth transistor M5 is coupled to the second power source VGL.

When the voltage at the second or third node N2 or N3 is higher by a threshold voltage than that of the second power source VGL, the fifth transistor M5 is turned on to allow the second node N2 to be electrically coupled to the third node N3. Otherwise, the fifth transistor M5 is turned off to allow the second node N2 to be isolated from the third node N3.

The sixth transistor M6 is coupled between the third node N3 and the second power source VGL. A gate electrode of the sixth transistor M6 is coupled to an input terminal I/P.

The sixth transistor M6 controls the voltage level at the third node N3 in response to a start pulse SP or output signal SSi-1 of a previous stage supplied to the input terminal I/P.

The voltage controller 40 is coupled between the first and second power sources VGH and VGL and further coupled to the input terminal I/P, the first input line 10 and the third node N3. The voltage controller 40 controls the voltage at the third node N3 in response to the start pulse SP or output signal SSi-1 of the previous stage and the first clock signal CLK1.

The voltage controller 40 includes seventh to ninth transistors M7 to M9 and first and second capacitors C1 and C2.

The seventh transistor M7 is coupled between the first power source VGH and the third node N3. A gate electrode of the seventh transistor M7 is coupled to a fourth node N4. The seventh transistor M7 controls the voltage level at the third node N3 corresponding to the voltage level at the fourth node N4.

The eighth transistor M8 is coupled between the first power source VGH and the fourth node N4. A gate electrode of the eighth transistor M8 is coupled to the input terminal I/P. The eighth transistor M8 controls the voltage level at the fourth node N4 in response to the start pulse SP or output signal SSi-1 of the previous stage supplied from the input terminal I/P.

The ninth transistor M9 is coupled between the fourth node N4 and the second power source VGL. A gate electrode of the ninth transistor M9 is coupled to the first input line 10. The ninth transistor M9 controls the voltage level at the fourth node N4 in response to the first clock signal CLK1.

The first capacitor C1 is coupled between the first power source VGH and the third node N3. When a voltage is supplied to the third node N3, the first capacitor C1 stores the voltage therein and maintains the voltage at the third node N3 with the voltage stored in a previous period during the period where the fifth and sixth transistors M5 and M6 are turned off.

The second capacitor C2 is coupled between the first power source VGH and the fourth node N4. The second capacitor C2 stabilizes the operation of the seventh transistor M7.

The voltage controller 40 stably maintains the voltage level at the third node N3 as a high level while a high-level voltage of the first power source VGH is output to the output node Nout by the first transistor M1. As a result, the fifth transistor M5 maintains a turned-on state, and therefore, the voltage level at the second node N2 is stably maintained as a high level.

The voltage controller 40 prevents off-current of the fifth transistor M5 that maintains a turned-off state while a low-level output signal SSi is supplied to the output node Nout. That is, the voltage controller 40 controls the voltage at the third node N3 so that a low voltage between the drain and source electrodes of the fifth transistor M5 is maintained. Consequently, the off-current of the fifth transistor M5 is prevented by the voltage controller 40.

The detailed operation of the voltage controller 40 will be described later with reference to FIG. 4.

The third capacitor C3 is coupled between the second node N2 and the output node Nout. When the voltage level of the third clock signal CLK3 is changed such that the second transistor M2 is turned on, the third capacitor C3 allows the voltage level at the second node N2 to be raised or dropped because of the capacitive coupling between the second node N2 and the output node Nout.

The fourth capacitor C4 is coupled between the first power source VGH and the first node N1. That is, the fourth capacitor C4 is coupled between the gate and source electrodes of the first transistor M1 so as to stabilize the operation of the first transistor M1.

As described above, the shift register is designed so that a path of leakage current generated through the second node N2 is minimized while a low-level output signal SSi is supplied to the output node Nout.

The leakage current may be generated due to the off-current of a transistor and the like. If the number of transistors each having a source or drain electrode coupled to the second node N2 is increased, the voltage at the second node N2 becomes unstable while a scan signal is output, and therefore, output characteristics of the shift register may be degraded.

However, the shift register is designed so that transistors each having a source or drain electrode coupled to the second node N2 are minimized as the fifth transistor M5. Accordingly, the path of leakage current generated through the second node N2 is minimized, and therefore, the output characteristics of the shift register are stable.

The voltage controller 40 controls the voltage at the third node N3 so that a low voltage between the drain and source electrodes of the fifth transistor M5 is maintained while the fifth transistor M5 is turned off. Consequently, the off-current of the fifth transistor M5 is prevented by the voltage controller 40. Accordingly, leakage current is effectively prevented.

Figure 4:
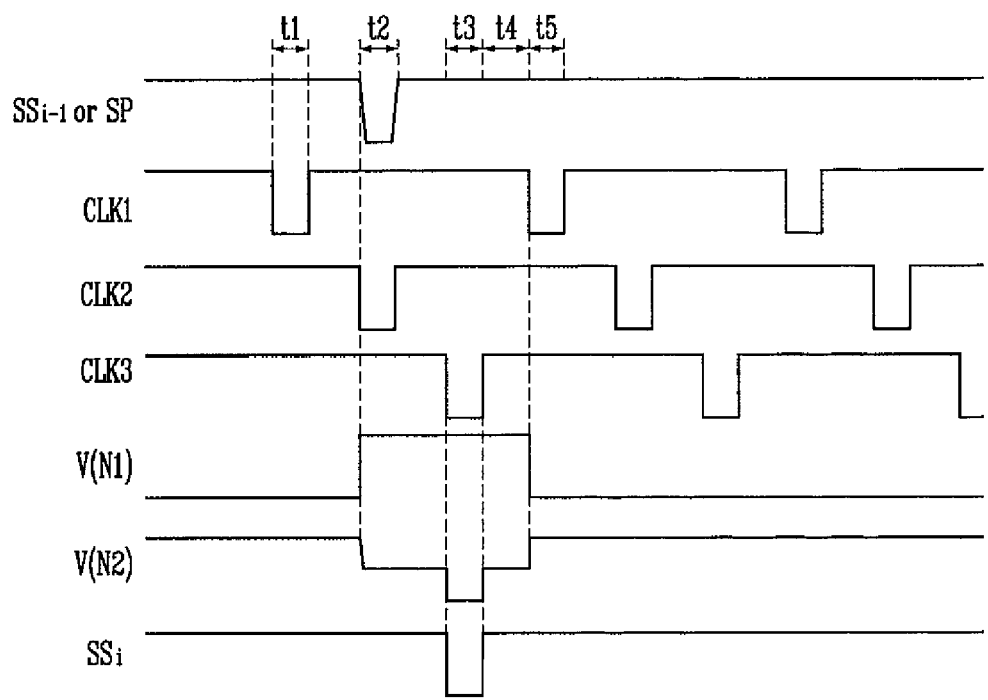
FIG. 4 is a waveform diagram showing input/output signals of the stage shown in FIG. 3.

Referring to FIG. 4, a low-level first clock signal CLK1 is first supplied to the first input line 10 during a first period t1. As a result, the fourth and ninth transistors M4 and M9 are turned on.

Because the fourth transistor M4 is turned on, the second power source VGL is electrically coupled to the first node N1, and the voltage V(N1) at the first node N1 becomes a low level. Accordingly, while the first transistor M1 maintains a turned-on state during the first period t1, the output signal SSi output through the output node Nout is maintained as a high level.

Because the ninth transistor M9 is turned on, the second power source VGL is electrically coupled to the fourth node N4, and the voltage at the fourth node N4 becomes a low level. Accordingly, the seventh transistor M7 is turned on to allow the first power source VGH to be electrically coupled to the third node N3, and therefore the voltage at the third node N3 becomes a high level.

Because the voltage at the third node N3 is a high level, the fifth transistor M5 maintains a turned-on state, and the voltage at the second node N2 also becomes a high level. Accordingly, the second transistor M2 maintains a turned-off state.

Thereafter, a low-level start pulse SP or output signal SSi-1 of a previous stage is supplied to the input terminal I/P during a second period t2. Accordingly, the third, sixth and eighth transistors M3, M6 and M8 are turned on.

Because the third transistor M3 is turned on, the first power source VGH is electrically coupled to the first node N1, and the voltage V(N1) at the first node N1 becomes a high level. Accordingly, the first transistor M1 is turned off.

Because the eighth transistor M8 is turned on, the first power source VGH is electrically coupled to the fourth node N4, and the voltage at the fourth node N4 becomes a high level. Accordingly, the seventh transistor M7 is turned off.

Because the sixth transistor M6 is turned on, the second power source VGL is electrically coupled to the third node N3, and the voltage at the third node N3 becomes a low level. As a result, the voltage at the third node N3 is a low level higher by the threshold voltage of the sixth transistor M6 than that of the second power source VGL.

During the second period t2, the seventh transistor M7 is turned off, and the voltage at the third node N3 is charged into the first capacitor C1. The fifth transistor M5 maintains a turned-on state during the second period t2, and the voltage V(N2) at the second node N2 drops from a high level to a low level.

Consequently, the second transistor M2 is turned on, and the third input line 30 is electrically coupled to the output node Nout. The third clock signal CLK3 is a high level during the second period t2, and therefore, the output signal SSi is maintained as a high level. As a result, a voltage at which the second transistor M2 is turned on is stored in the third capacitor C3.

Thereafter, when the voltage level of the third clock signal CLK3 transitions to a low level during a third period t3, the voltage V(N2) at the second node N2 transitions to a low level lower than the voltage level of the third clock signal CLK3 due to the coupling of a parasitic capacitor (not shown) of the second transistor M2 and the third capacitor C3. Accordingly, while the second transistor M2 stably maintains a turned-on state, the low-level voltage of the third clock signal CLK3 is output to the output node Nout. That is, a low-level scan signal SSi is output to the output node Nout during the third period t3.

Meanwhile, the voltage V(N2) at the second node N2 becomes a low level lower than the voltage level of the third clock signal CLK3 during the third period t3, and the fifth transistor M5 is turned off.

The voltage at the third node N3 is maintained as a low level similar to that during the second period t2. Therefore, the voltage between the drain and source electrodes of the fifth transistor M5 is maintained low so that off-current is effectively prevented.

Therefore, leakage current generated through the second node N2 is effectively prevented regardless of the off-current characteristics of the transistors included in the shift register. More particularly, off-current characteristics of the fifth transistor M5 coupled to the second node N2 does not influence the output of the shift register.

Accordingly, the voltage V(N2) of the second node N2 is stably maintained low during the corresponding scan period (i.e., the third period t3), thereby stabilizing output characteristics of the shift register.

When the voltage level of the third clock signal CLK3 supplied to the third input line 30 becomes a high level during a fourth period t4, the voltage V(N2) at the second node N2 rises to a voltage level similar to that during the second period t2. The second transistor M2 maintains a turned-on state during the fourth period t4, and the voltage level of the third clock signal CLK3 is transferred to a high level. Therefore, the voltage of the scan signal SSi is again a high level.

Thereafter, a low-level first clock signal CLK1 is again supplied to the first input line 10 during a fifth period t5. Consequently, the fourth and ninth transistors M4 and M9 are turned on.

Because the fourth transistor M4 is turned on, the voltage V(N1) at the first node N1 again becomes a low level. Because the ninth transistor M9 is turned on, the seventh transistor M7 is turned on, and the voltage at the third node N3 becomes a high level. Since the fifth transistor M5 also maintains a turned-on state during the fifth period t5, the voltage at the second node N2 again becomes a high level.

A low-level start pulse SP or output signal of the previous stage is not supplied to the stage STi until a corresponding period of a next frame. Therefore, the voltages V(N1) and V(N2) at the first and second nodes N1 and N2 are maintained.

Through the driving described above, each of the stages of the shift register according to the embodiment outputs a scan signal obtained by allowing a start pulse SP or output signal SSi-1 of a previous stage input to each of the stages ST to be phase-delayed by, one clock in response to the first to third clock signals CLK1 to CLK3.

Particularly, while a scan signal SSi is output, the path of leakage current is minimized, and the voltage between the drain and source electrodes of the fifth transistor M5 is maintained low, thereby preventing off-current of the fifth transistor M5. Accordingly, the leakage current is effectively prevented, and output characteristics of the shift register is stable.

Furthermore, to improve leakage current characteristics, at least one transistor on a path through which leakage current could be generated may be implemented as a plurality of transistors.

Figure 5:
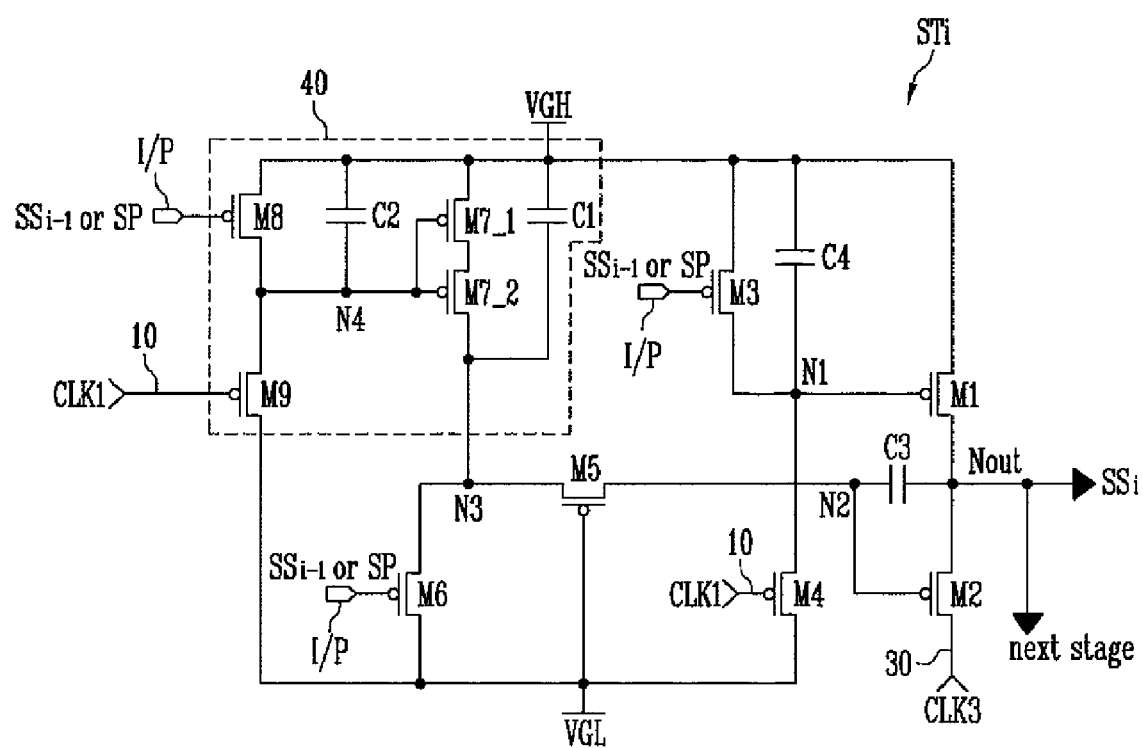
FIG. 5 is a circuit diagram showing another example of the stage shown in FIG. 2.

For example, as shown in FIG. 5, the seventh transistor M7 may be implemented as a plurality of transistors. That is, the seventh transistor M7 may be implemented as a plurality of transistors M7_1 and M7_2 that have gate electrodes commonly coupled to the fourth node N4 and are coupled in series to each other.

It is apparent that such a modification may be applied to the other transistors.

While the present invention has been described in connection with certain exemplary embodiments, it is to be understood that the invention is not limited to the disclosed embodiments, but, on the contrary, is intended to additionally cover various modifications and equivalent arrangements.

What is claimed is:

1. A shift register comprising a plurality of serially connected stages, wherein one of the stages is connected to an input line of a start pulse, the shift register being driven by first, second, and third clock signals, respectively input to first, second and third input lines, wherein each of the stages comprises:

a first transistor coupled between a first power source and an output node, the first transistor having a gate electrode coupled to a first node;

a second transistor coupled between the output node and the third input line, the second transistor having a gate electrode coupled to a second node;

a third transistor coupled between the first power source and the first node, the third transistor having a gate electrode coupled to an input terminal to which the start pulse or an output signal of a previous stage is input;

a fourth transistor coupled between the first node and a second power source, the fourth transistor having a gate electrode coupled to the first input line;

a fifth transistor coupled between the second node and a third node, the fifth transistor having a gate electrode coupled to the second power source;

a sixth transistor coupled between the third node and the second power source, the sixth transistor having a gate electrode coupled to the input terminal; and a voltage controller coupled between the first and second power sources, the voltage controller being further coupled to the input terminal, the first input line and the third node, wherein the voltage controller is configured to control the voltage at the third node in response to the start pulse or output signal of the previous stage and the first clock signal.

2. The shift register of claim 1, wherein the voltage controller comprises:

a seventh transistor coupled between the first power source ad the third node, the seventh transistor having a gate electrode coupled to a fourth node;

an eighth transistor coupled between the first power source and the fourth node, the eighth transistor having a gate electrode coupled to the input terminal;

a ninth transistor coupled between the fourth node and the second power source, the ninth transistor having a gate electrode coupled to the first input line; and a first capacitor coupled between the first power source and the third node.

3. The shift register of claim 2, wherein the seventh transistor comprises a plurality of transistors that each have gate electrodes coupled to the fourth node and are coupled in series to the others of the plurality of transistors.

4. The shift register of claim 2, wherein the voltage controller further comprises a second capacitor coupled between the first power source and the fourth node.

5. The shift register of claim 2, wherein each of the stages further comprises a third capacitor coupled between the second node and the output node.

6. The shift register of claim 1, wherein each of the stages further comprises a fourth capacitor coupled between the first power source and the first node.

7. The shift register of claim 1, wherein the first, second and third clock signals have waveforms whose phases are sequentially delayed.

8. An organic light emitting display device comprising:

a pixel unit having a plurality of pixels positioned near intersections of scan and data lines;

a data driving unit configured to apply data signals to the data lines, a scan driving unit having a shift register configured to sequentially apply scan signals to the scan lines, wherein:

the shift register comprises a plurality of serially connected stages, wherein one of the stages is connected to an input line of a start pulse and is driven by first, second and third clock signals respectively input to first, second and third input lines, and each of the stages comprises:

a first transistor coupled between a first power source and an output node, the first transistor having a gate electrode coupled to a first node;

a second transistor coupled between the output node and the third input line, the second transistor having a gate electrode coupled to a second node;

a third transistor coupled between the first power source and the first node, the third transistor having a gate electrode coupled to an input terminal to which the start pulse or an output signal of a previous stage is input;

a fourth transistor coupled between the first node and a second power source, the fourth transistor having a gate electrode coupled to the first input line;

a fifth transistor coupled between the second node and a third node, the fifth transistor having a gate electrode coupled to the second power source;

a sixth transistor coupled between the third node and the second power source, the sixth transistor having a gate electrode coupled to the input terminal; and a voltage controller coupled between the first and second power sources, the voltage controller being further coupled to the input terminal, the first input line, and the third node, wherein the voltage controller is configured to control the voltage at the third node in response to the start pulse or output signal of the previous stage and the first clock signal.

9. The organic light emitting display device of claim 8, wherein the voltage controller comprises:

a seventh transistor coupled between the first power source ad the third node, the seventh transistor having a gate electrode coupled to a fourth node;

an eighth transistor coupled between the first power source and the fourth node, the eighth transistor having a gate electrode coupled to the input terminal;

a ninth transistor coupled between the fourth node and the second power source, the ninth transistor having a gate electrode coupled to the first input line; and a first capacitor coupled between the first power source and the third node.

10. The organic light emitting display device of claim 9, wherein the seventh transistor comprises a plurality of transistors that each have gate electrodes coupled to the fourth node and are coupled in series to the others of the plurality of transistors.

11. The organic light emitting display device of claim 9, wherein the voltage controller further comprises a second capacitor coupled between the first power source and the fourth node.

12. The organic light emitting display device of claim 8, wherein the stage further comprises a third capacitor coupled between the second node and the output node.

13. The organic light emitting display device of claim 8, wherein the stage further comprises a fourth capacitor coupled between the first power source and the first node.

14. The organic light emitting display device of claim 8, wherein the first, second and third clock signals have waveforms whose phases are sequentially delayed.

15. A shift register comprising a plurality of serially connected stages, wherein one of the stages is connected to an input line of a start pulse, the shift register being driven by first, second, and third clock signals, respectively input to first, second and third input lines, wherein each of the stages comprises:

a first transistor coupled between a first power source and an output node, the first transistor having a gate electrode coupled to a first node;

a second transistor coupled between the output node and the third input line, the second transistor having a gate electrode coupled to a second node;

a third transistor coupled between the first power source and the first node, the third transistor having a gate electrode coupled to an input terminal to which the start pulse or an output signal of a previous stage is input;

a fourth transistor coupled between the first node and a second power source, the fourth transistor having a gate electrode coupled to the first input line;

a fifth transistor coupled between the second node and a third node, the fifth transistor having a gate electrode coupled to the second power source;

a sixth transistor coupled between the third node and the second power source, the sixth transistor having a gate electrode coupled to the input terminal; and means for controlling the voltage at the third node in response to the start pulse or output signal of the previous stage and the first clock signal.

16. The shift register of claim 15, wherein the means for controlling comprises:
    a seventh transistor coupled between the first power source ad the third node, the seventh transistor having a gate electrode coupled to a fourth node;
    an eighth transistor coupled between the first power source and the fourth node, the eighth transistor having a gate electrode coupled to the input terminal;
    a ninth transistor coupled between the fourth node and the second power source, the ninth transistor having a gate electrode coupled to the first input line; and
    a first capacitor coupled between the first power source and the third node.

17. The shift register of claim 16, wherein the seventh transistor comprises a plurality of transistors that each have gate electrodes coupled to the fourth node and are coupled in series to the others of the plurality of transistors.

18. The shift register of claim 16, wherein the means for controlling further comprises a second capacitor coupled between the first power source and the fourth node.

19. The shift register of claim 16, wherein each of the stages further comprises a third capacitor coupled between the second node and the output node.

20. The shift register of claim 15, wherein each of the stages further comprises a fourth capacitor coupled between the first power source and the first node.

* * * * *

UNITED STATES PATENT AND TRADEMARK OFFICE
CERTIFICATE OF CORRECTION

PATENT NO. : 8,232,954 B2  
APPLICATION NO. : 12/568588  
DATED : July 31, 2012  
INVENTOR(S) : Sam-Il Han Page 1 of 1

It is certified that error appears in the above-identified patent and that said Letters Patent is hereby corrected as shown below:

In Column 9, Line 15 (Approx.), please delete "ad" and insert therefore, --and--.

In Column 10, Line 18, please delete "ad" and insert therefore, --and--.

In Column 11, Line 10, please delete "ad" and insert therefore, --and--.

Signed and Sealed this  
Nineteenth Day of February, 2013

Teresa Stanek Rea  
*Acting Director of the United States Patent and Trademark Office*